United States Patent
Saito et al.

(10) Patent No.: US 7,628,931 B2
(45) Date of Patent: Dec. 8, 2009

(54) PROCESSING METHOD FOR CONSERVATION OF PROCESSING GASES

(75) Inventors: Masashi Saito, Yamanashi (JP); Yusuke Hirayama, Yamanashi (JP); Itsuko Sakai, Kanagawa (JP); Tokuhisa Ohiwa, Kanagawa (JP)

(73) Assignees: Tokyo Electron Limited (JP); Kabushiki Kaisha Toshiba (JP)

( * ) Notice: Subject to any disclaimer, the term of this patent is extended or adjusted under 35 U.S.C. 154(b) by 384 days.

(21) Appl. No.: 11/197,434

(22) Filed: Aug. 5, 2005

(65) Prior Publication Data

US 2005/0279731 A1 Dec. 22, 2005

Related U.S. Application Data

(63) Continuation of application No. 09/686,370, filed on Oct. 12, 2000, now abandoned.

(30) Foreign Application Priority Data

Oct. 13, 1999 (JP) ................................. 11-291270

(51) Int. Cl.
  H01L 21/00 (2006.01)
  C23C 14/00 (2006.01)
  C23C 16/00 (2006.01)
(52) U.S. Cl. ..................... 216/58; 156/345.29; 118/715
(58) Field of Classification Search ................ 118/715; 156/345.29, 345.33
See application file for complete search history.

(56) References Cited

U.S. PATENT DOCUMENTS 3,854,443 A 12/1974 Baerg
5,453,124 A 9/1995 Moslehi et al.
6,086,677 A 7/2000 Umotoy et al.
6,277,173 B1 * 8/2001 Sadakata et al. ............... 95/12

FOREIGN PATENT DOCUMENTS

JP 04-107280 A 4/1992
JP 09-251981 A 11/1997

* cited by examiner

Primary Examiner—Ram N Kackar
(74) Attorney, Agent, or Firm—Finnegan, Henderson, Farabow, Garrett & Dunner, L.L.P.

(57) ABSTRACT

In order to facilitate control of a circulating gas, in a processing apparatus 100 having a showerhead 200 for supplying a processing gas into a processing chamber via a plurality of gas supply holes, a turbo pump 120 for evacuating the processing gas from the processing chamber 110 and a circulating gas piping 150 for returning at least a portion (circulating gas Q2) of the exhaust gas evacuated from the processing chamber by the turbo pump to the showerhead, the showerhead is provided with a primary gas supply system that supplies a primary gas Q1 supplied from a gas source 140 into the processing chamber via a plurality of primary gas outlet holes h1 and a circulating gas supply system that supplies the circulating gas into the processing chamber via a plurality of circulating gas supply holes h2, with the primary gas supply system and the circulating gas supply system constituted as systems independent of each other. Since the primary gas and the circulating gas are allowed to become mixed only in the processing chamber, the circulating gas can be controlled with a greater degree of ease without having to implement pressure control.

6 Claims, 9 Drawing Sheets

PROCESSING METHOD FOR CONSERVATION OF PROCESSING GASES

CROSS-REFERENCE TO RELATED APPLICATIONS

This is a continuation application of U.S. patent application Ser. No. 09/686,370, filed Oct. 12, 2000 now abandoned, the entirety of which is incorporated herein by reference. This application also claims the benefits of priority under 35 U.S.C § 119(a)-(d) to Japanese Patent Application No. 11-291270, filed Oct. 13, 1999.

BACKGROUND OF THE INVENTION

1. Field of the Invention

The present invention relates to a processing apparatus.

2. Description of the Related Art

Gases containing great quantities of fluorine atoms are used as etching gases in etching technologies in order to develop a reaction seed containing fluorine through plasma discharge or the like. As increasingly vigorous efforts have been made to protect the global environment on an international scale in recent years, global warming, in particular, is one of the most important issues to be addressed. Under these circumstances, reduction in the quantity of atmospheric emissions of fluorine compounds used in dry etching technologies in the prior art, which have long atmospheric life and high global warming coefficients, has become an urgent goal that we must achieve to prevent further global warming.

As a means for reducing the emission quantity of the processing gas containing fluorine compounds in the dry etching technologies, recycling of the processing gas, which may be achieved by circulating the processing gas inside the processing apparatus, has been proposed (hereafter, the processing gas that is circulated for this purpose is referred to as the "circulating gas"). Namely, a processing apparatus provided with a gas circulating mechanism that returns into the processing chamber at least a portion of the gas evacuated from the processing chamber by an evacuating mechanism has been proposed. By recycling the gas with such a gas circulating mechanism, both the quantity of gas emission and the quantity of gas consumption can be reduced, thereby contributing to the effort to prevent further global warming and also achieving a reduction in the cost of processing gas.

In addition, a gas supply mechanism having a showerhead structure has been proposed to supply the processing gas into the processing chamber evenly. This gas supply mechanism is often utilized in conjunction with the gas circulating mechanism described above. In other words, at least a portion of the exhaust gas evacuated from the processing chamber by the evacuating mechanism is circulated into the showerhead type gas supply mechanism and supplying the circulating gas to the workpiece inside the processing chamber in a shower, the efficiency with which the processing gas is utilized is further improved.

In a processing apparatus provided with the gas circulating mechanism and the gas supply mechanism described above, the pressure (back-pressure) on the downstream side of the evacuating mechanism must be set higher than the pressure on the upstream side of the gas supply mechanism at all times in order to circulate the processing gas with a high degree of efficiency. The rated back-pressure of a turbo pump which is normally used as the evacuating mechanism is most often 2~3 Torr, and may be approximately 10 Torr in special cases. If the back-pressure of the turbo pump exceeds the rated back-pressure, the evacuating capability becomes greatly reduced. In addition, while the gas supply mechanism is connected to a processing gas source for supplying a processing gas (hereinafter referred to as a "primary gas") directly into the processing chamber from the outside of the apparatus, the pressure in the primary gas piping is normally 1 atmosphere (760 Torr) or higher, and even if a flow regulating device (mass flow controller) is employed to reduce the flow rate of the primary gas and thus the pressure in the primary gas piping is reduced, the gas pressure level cannot be decreased any lower than approximately several Torr~several tens of Torr.

As described above, while the processing apparatus in the prior art may be considered effective in reducing emission the processing gas and the quantity of processing gas consumption by recycling the processing gas, it is not equipped with a fully functioning gas circulating mechanism. Namely, when a circulating gas piping is provided between the downstream side of the evacuating mechanism sand the upstream side of the gas supply mechanism as in the processing apparatus in the prior art, a problem arises in that efficient gas circulation is not achieved since the back-pressure of the evacuating mechanism is approximately 10 Torr and the pressure on the upstream side of the gas supply mechanism can be lowered only down to several Torr~several tens of Torr.

SUMMARY OF THE INVENTION

An object of the present invention, which has been completed by addressing the problem of the processing apparatus in the prior art discussed above, is to provide a new and improved processing apparatus capable of controlling the circulating gas with ease.

In order to achieve the object described above, the processing apparatus comprises a gas supply mechanism that supplies a processing gas into a processing chamber via a plurality of gas supply holes, an evacuating mechanism that evacuates the processing gas from the processing chamber and a gas circulating mechanism that returns at least a portion of the exhaust gas evacuated from the processing chamber by the evacuating mechanism to the gas supply mechanism. The gas supply mechanism is provided with a primary gas supply system that supplies a primary gas supplied from a processing gas source into the processing chamber via a plurality of primary gas supply holes and a circulating gas supply system that supplies at least a portion of the exhaust gas into the processing chamber via a plurality of circulating gas supply holes, with the primary gas supply system and the circulating gas supply system constituted as systems independent of each other.

Since the primary gas supply system and the circulating gas supply system are provided as systems independent of each other in the gas supply mechanism in this structure, the primary gas and at least a portion (the circulating gas) of the exhaust gas are allowed to become mixed only inside the processing chamber. Thus, easy control of the circulating gas is achieved without having to implement pressure control such as reducing the pressure on the upstream side of the primary gas supply system and raising the back-pressure at the evacuating mechanism. In addition, since the primary gas supply system and the circulating gas supply system are constituted as systems independent of each other, the pressure and the flow rate at either can be independently controlled without being affected by the other gas supply system.

Furthermore, the conductance at the circulating gas supply system must be adjusted so as to ensure that the evacuating capability of the evacuating mechanism is not compromised. While the evacuating capability of the evacuating mechanism is affected by the back-pressure of the evacuating mechanism, the conductance of the circulating gas supply system must be adjusted so as to set the back-pressure at 3 Torr or lower in the standard evacuating mechanism employed in a conventional processing apparatus. Or, if a special evacuating mechanism is employed, the back-pressure must be adjusted to 10 Torr or lower.

The hole radius and the hole density of the gas supply holes may be set as follows.

(a) A constant hole radius and a constant hole density of the entire surface.

By adopting the structure, (a) the primary gas and the circulating gas can be supplied at the same flow rate per unit area. In addition, the gases can be supplied at a constant flow rate through all the gas supply holes. Thus, uniformity is assured in the processing performed on the workpiece.

(b) A constant hole radius over the entire surface and a hole density set so as to ensure that the back-pressure is equal to or lower than the rated back-pressure of the evacuating mechanism when the circulating gas is supplied at a target flow rate.

(c) A constant hole density of the entire surface and a hole radius set so as to ensure that the back-pressure is equal to or lower than the rated back-pressure of the evacuating mechanism when the circulating gas is supplied at a target flow rate.

By adopting the structure in either (b) or (c), the primary gas and the circulating gas can be supplied at the same flow rate per unit area even when the rated back-pressure of the evacuating mechanism is low.

In any of the cases described above, it is desirable to ensure that the ratio of the number of primary gas supply holes and the number of circulating gas supply holes per unit area in the gas supply mechanism is consistent over the entire surface of the gas supply mechanism.

Furthermore, by setting the conductance of the circulating gas supply system higher than the conductance of the gas supply mechanism, the control of the circulating gas is facilitated.

It is desirable to provide a second primary gas supply system for supplying the primary gas through the circulating gas supply holes with the second primary gas supply system having a means for primary gas flow rate adjustment. But adopting this structure, the circulating gas supply holes can also be utilized as primary gas supply holes when processing that does not require the circulating gas is implemented. By providing the means for flow rate adjustment at the second primary gas piping in this structure, better flow control is achieved when supplying the primary gas through the circulating gas supply holes. It also achieves better flow control when implementing sequential processing whereby processing using only the primary gas is performed and then processing using the primary gas and the circulating gas is performed.

Furthermore, it is desirable to provide a buffer space in the gas circulating mechanism and/or the circulating gas supply system. This structure allows the circulating gas remaining at the gas circulating mechanism and/or the circulating gas supply system to be temporarily reserved in the buffer structure when the processing is completed, so that the gas can be utilized in the next process. Thus, since it is not necessary to evacuate the gas remaining in the circulating gas supply system, the emission quantity of the gas is reduced. In addition, the quantity of gas consumed in the next process is reduced and the length of time required for performing the initial setting for the next process can be reduced as well.

Moreover, it is desirable to provide a means for circulating gas filtration at the gas circulating mechanism and/or the circulating gas supply system. Since byproducts, and particles contained in the circulating gas are removed in this structure, the degree to which the workpiece is adversely affected by circulating the gas is minimized and easier maintenance is assured.

The rate at which the primary gas is supplied through the primary gas supply holes into the processing chamber and the rate at which the circulating gas is supplied through the circulating gas supply holes into the processing chamber should be preferably high. For instance, the rate at which the primary gas is supplied through the primary gas supply holes into the processing chamber and/or the rate at which the circulating gas is supplied through the circulating gas supply holes into the processing chamber should be equal to or higher than 500 m/sec. Since byproducts and particles generated inside the processing chamber are prevented from becoming adhered to the circulating gas supply holes in this structure, the degree to which the workpiece is adversely affected is minimized and maintenance work is facilitated.

BRIEF DESCRIPTION OF THE DRAWINGS

Further objects and advantages of the invention can be more fully understood from the following detailed description taken in conjunction with the accompanying drawings, in which.

DETAILED DESCRIPTION OF THE PREFERRED EMBODIMENTS

The following is a detailed explanation of the preferred embodiments of the processing apparatus according to the present invention, given in reference to the attached drawings. It is to be noted that in the specification and the drawings, the same reference numbers are assigned to components having essentially identical functions and structural features to preclude the necessity for repeated explanation thereof.

First Embodiment

The first embodiment of the present invention is now explained.

Figure 1:
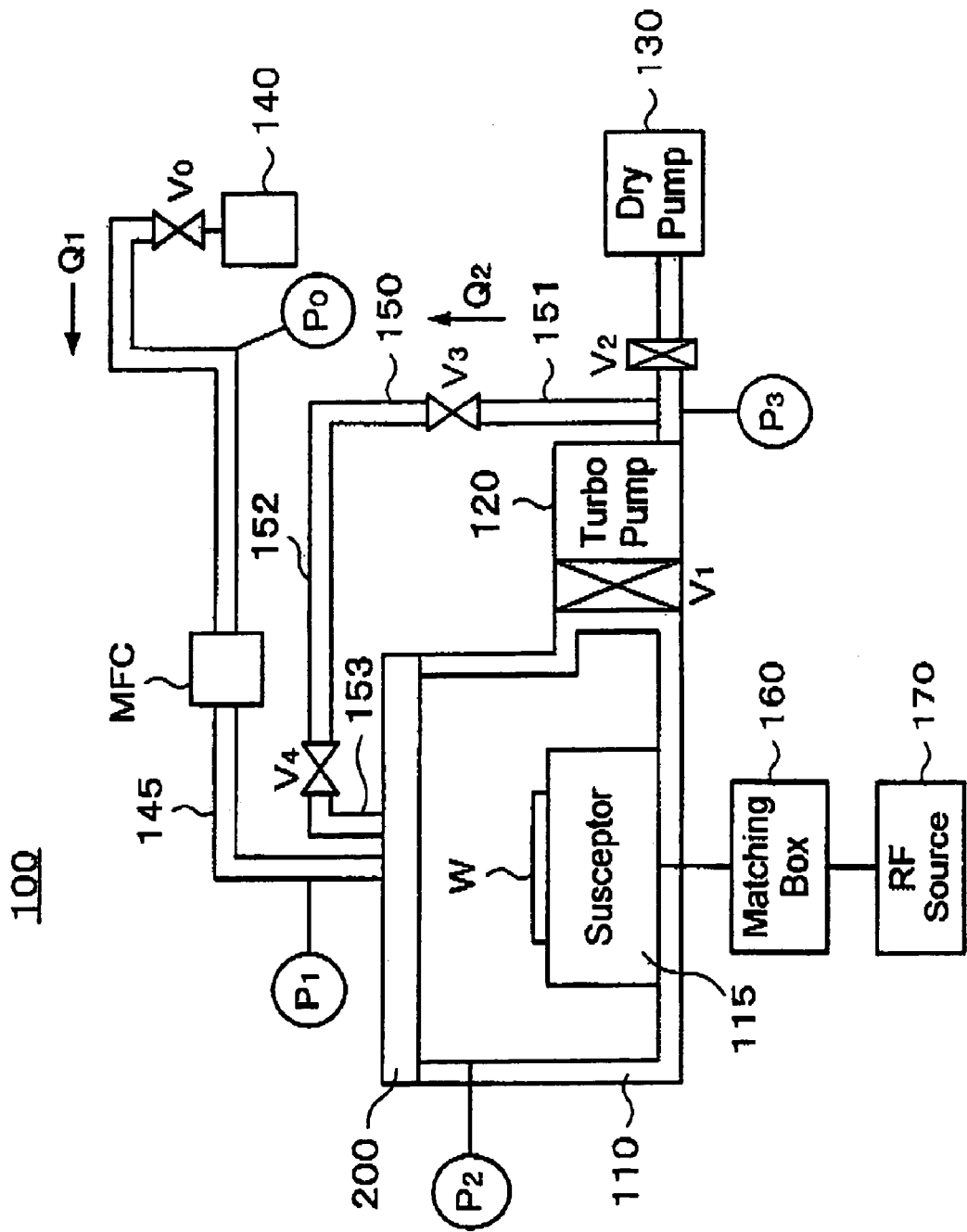
FIG. 1 illustrates the internal structure of the processing apparatus in a first embodiment.

A processing apparatus 100 in the embodiment is explained in reference to FIG. 1. It is to be noted that FIG. 1 schematically illustrates the internal structure of the processing apparatus 100.

(Processing Apparatus 100)

As shown in FIG. 1, the processing apparatus 100 mainly comprises a processing chamber 110, a showerhead 200 provided in the upper portion of the processing apparatus 100, which constitutes an example of a gas supply mechanism for supplying a process gas into the processing chamber 110 via a plurality of gas supply holes, a turbo pump 120 constituting an example of an evacuating mechanism for evacuating the processing gas from the processing chamber 110, a dry pump 130 for further evacuating the processing gas to reduce the pressure on the downstream side of the turbo pump 120, a primary gas piping 145 through which the processing gas (primary gas) Q1 supplied from a gas source 140 is supplied to the showerhead 200 and a circulating gas piping 150 constituting a gas circulating mechanism that returns at least a portion (circulating gas) Q2 of the exhaust gas evacuated by the turbo pump 120 to the showerhead 200.

The internal structure of the processing apparatus 100 is explained in reference to FIG. 1.

A valve V0 and a flow regulating device (mass flow controller) M F C that control the flow rate of the primary gas from the gas source 140 and a vacuum gauge P0 that measures the pressure inside a primary gas piping 145 are inserted at the primary gas piping 145 connected to the gas source 140. The primary gas piping 145 is also connected with the showerhead 200 located at the upper portion of the processing chamber 110.

A susceptor 115 on which a workpiece, i.e., a semiconductor wafer (hereafter referred to as a "wafer") W is placed is provided inside the processing chamber 110. A high-frequency source 170 is connected to the susceptor 115 via a matching box 160. In addition, a vacuum gauge P2 for measuring the pressure inside the processing chamber 110 is provided.

The turbo pump 120 is provided via a valve V1 on the evacuating side of the processing chamber 110, and a valve V2 for controlling the back-pressure of the turbo pump 120 and a vacuum gauge P3 for measuring the back-pressure of the turbo pump 120 are provided on the downstream side of the turbo pump 120. On the downstream side of the valve V2, the dry pump 130 that further evacuates the processing gas to reduce the pressure on the downstream side of the turbo pump 120 is provided. One end of the circulating gas piping 150 for circulating the gas Q2 is connected between the turbo pump 120 and the valve V2, with the other end thereof connected to the showerhead 200.

Inside the circulating gas piping 150, a valve V3 is provided on the upstream side and a valve V4 is provided on the downstream side. The portion of the circulating gas piping 150 enclosed by the valve V3 and the valve V4 functions as a buffer space in which the circulating gas Q2 is temporarily reserved. This aspect of the structure is to be detailed later.

While the structure of the processing apparatus 100 in the embodiment is explained above, this structure simply represents an example. For instance, it is not necessary to individually provide the four vacuum gauges P0, P1, P2 and P3 as described above, and it is only required that essentially the pressure levels at the four locations mentioned above be measured. In addition, a plurality of valves may be provided in series as necessary to prevent a gas leak through the valves.

The following is an explanation of the gas supply mechanism which characterizes the processing apparatus 100 in the embodiment. The showerhead 200 and a showerhead 300 are described as structural examples that may be adopted in the gas supply mechanism in the embodiment.

(Showerhead 200)

Figure 2:
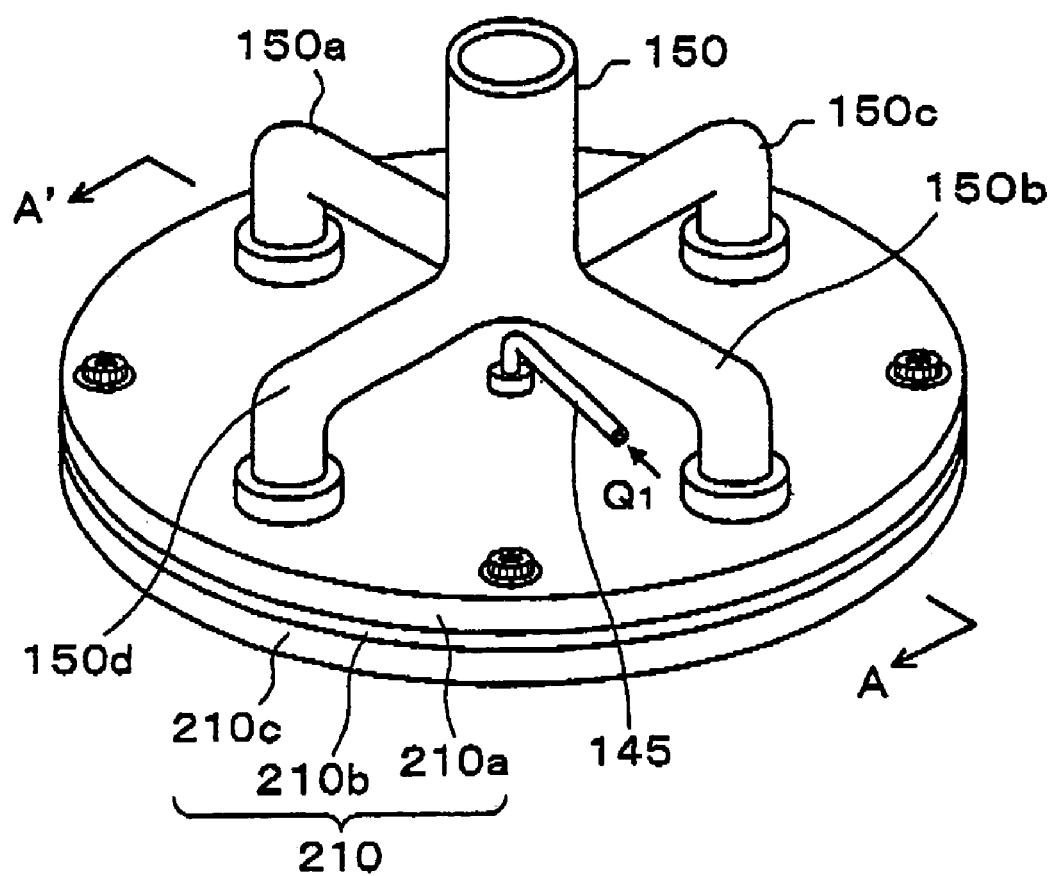
FIG. 2 presents an external view of the showerhead.
Figure 3:
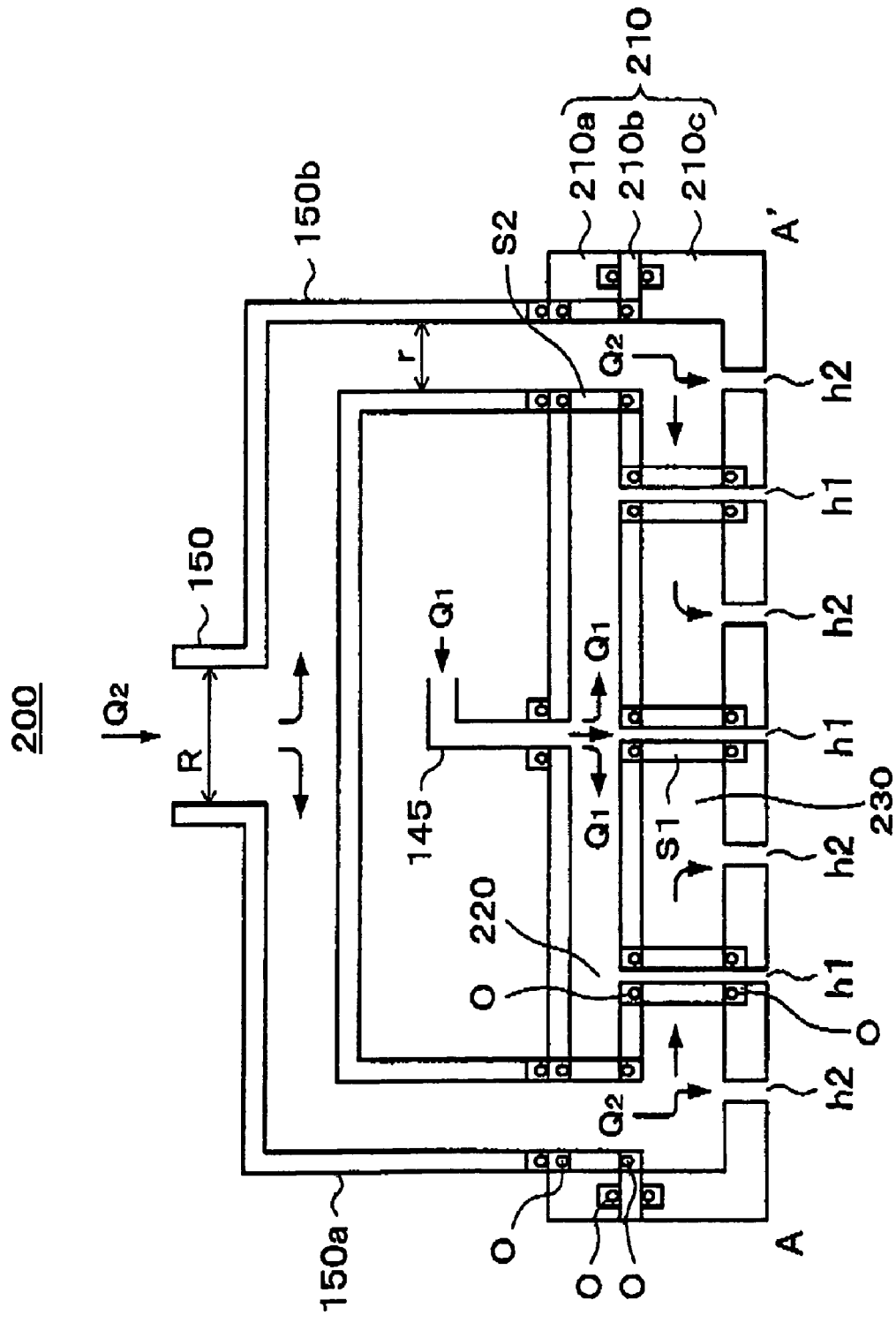
FIG. 3 is a sectional view of the showerhead across A-A' in FIG. 2.
Figure 4:
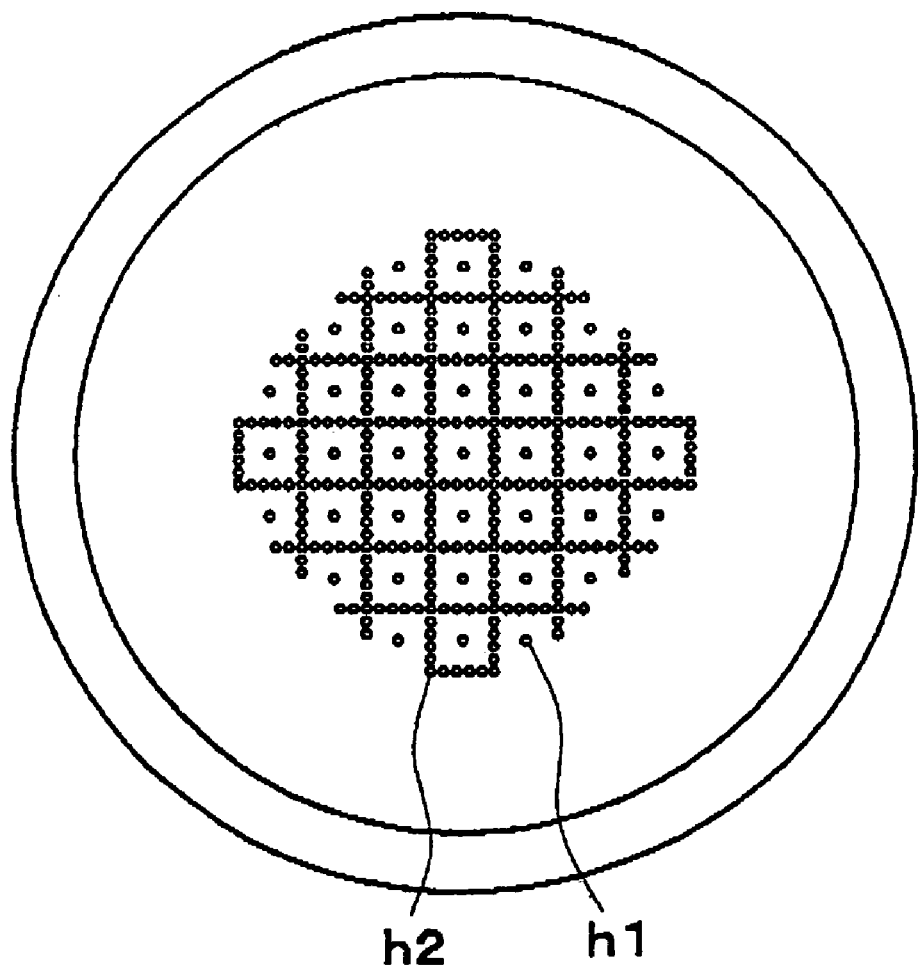
FIG. 4 presents an example of how the gas supply holes in the showerhead in FIG. 2 may be arranged.

The showerhead 200 representing an example of the gas supply mechanism is now explained in reference to FIGS. 2~4. It is to be noted that FIG. 2 is a perspective schematically illustrating an external view of the showerhead 200 and FIG. 3 is a sectional view across A-A' in FIG. 2. FIG. 4 illustrates the arrangement of the gas supply holes.

The showerhead 200 representing an example of the gas supply mechanism is provided with a primary gas supply system for supplying the primary gas Q1 supplied from the gas source 140 into the processing chamber 110 via a plurality of primary gas supply holes h1 and a circulating gas supply system for supplying the circulating gas Q2 into the processing chamber 110 via a plurality of circulating gas supply holes h2, with the primary gas supply system and the circulating gas supply system constituted as systems independent of each other. The following is a detailed explanation of the structural example that may be adopted in such a showerhead 200.

As illustrated in FIG. 2, the showerhead 200 comprises three electrode plates 210 (a first electrode plate 210a, a second electrode plate 210b and a third electrode plate 210c), which may be constituted of, for instance, alumite. The uppermost first electrode plate 210a is made to communicate with the primary gas piping 145 and the circulating gas piping 150. In the example illustrated in the figure, the circulating gas piping 150 forks off in four pipings 150a, 150b, 150c and 150d to prevent the conductance from becoming lowered and to facilitate the dispersion inside the showerhead 200. The piping radius r of the four pipings 150a, 150b, 150c and 150d is set at approximately half the piping radius R of the circulating gas piping 150 with the total of the sectional areas of the four pipings 150a, 150b, 150c and 150d essentially equal to the sectional area of the circulating gas piping 150. For instance, the piping radius R of the circulating gas piping 150 may be approximately 40 mm, with the piping radius r of the pipings 150a, 150b, 150c and 150d set at approximately 20 mm.

In addition, it is desirable to assume a structure for the showerhead 200 that allows it to be disassembled into parts with simple shapes, in order to facilitate the removal of byproducts and particles generated at the head surface, the internal gas path and the like during the process, and the structure shown in FIG. 2 allows the showerhead 200 to be disassembled into the three electrode plates to facilitate maintenance work.

The internal structure of the showerhead 200 is explained in reference to FIG. 3.

First, the primary gas supply system is explained.

The space between the first electrode plate 210a and the second electrode plate 210b, which is made to communicate with the primary gas piping 145, constitutes a primary gas dispersion space 220 where the primary gas Q1 is dispersed. The primary gas dispersion space 220 is made to communicate with a plurality of primary gas supply holes h1 via a passage defined by a spacer S1 in the space between the second electrode plate 210b and the third electrode plate 210c. Orings (sealing members) O are provided at the areas where the spacer s1 comes in contact with each of the second electrode plate 210b and the third electrode plate 210c so as to prevent the primary gas Q1 and the circulating gas Q2 from becoming mixed. The primary gas supplied through the primary gas piping 145 is first dispersed through the primary gas dispersion space 220 and then supplied into the processing chamber 110 in a shower through the plurality of primary gas supply holes h1.

Next, the circulating gas supply system is explained.

The space between the second electrode plate 210b and the third electrode plate 210c is made to communicate with the circulating gas piping 150 (150a, 150b, 150c and 150d) and constitutes a circulating gas dispersion space 230 in which the circulating gas Q2 is dispersed. The circulating gas piping 150 is made to communicate with the circulating gas dispersion space 230 via a passage defined by a spacer s2 in the space between the first electrode plate 210a and the second electrode plate 210b. Orings (sealing members) O are provided at the areas where the spacer s2 comes in contact with each of the first electrode plate 210a and the second electrode plate 210b, so as to prevent the primary gas Q1 and the circulating gas Q2 from becoming mixed. The circulating gas dispersion space 230 is made to communicate with a plurality of circulating gas supply holes h2. The circulating gas Q2 supplied through the circulating gas piping 150 is first dispersed through the circulating gas dispersion space 230 and then is supplied into the processing chamber 110 in a shower through the plurality of circulating gas supply holes h2.

The primary gas supply holes h1 and the circulating gas supply holes h2 are formed at optimal positions determined through experience, simulation or the like so as to ensure that the gas induced from the showerhead 200 into the processing chamber 110 travels onto the surface of the wafer W evenly. FIG. 4 presents an example of the arrangement of the primary gas supply holes h1 and the circulating gas supply holes h2 which may be assumed in conjunction with a regular turbo pump (with a back-pressure and of approximately 2~3 mTorr).

In FIG. 4, approximately 40 primary gas supply holes h1 are bored, with their hole radius set at approximately 1 mm. Approximately 300 circulating gas supply holes h2 are bored so as to surround the primary gas supply holes h1, and the radius of the individual circulating gas supply holes is set at approximately 1 mm. As described above, the hole radius and the hole density of the gas supply holes are constant over the entire surface, and the ratio of the number of primary gas supply holes h1 and the number of circulating gas supply holes h2 is set to equal to the ratio of the target flow rate for the primary gas Q1 and the target flow rate for the circulating gas Q2 in FIG. 4. In addition, the hole density of the circulating gas supply holes h2 is set to ensure that the back-pressure is equal to or lower than the rated back-pressure of the turbo pump 120 when the circulating gas Q2 is supplied at the target flow rate.

(Showerhead 300)

Figure 5:
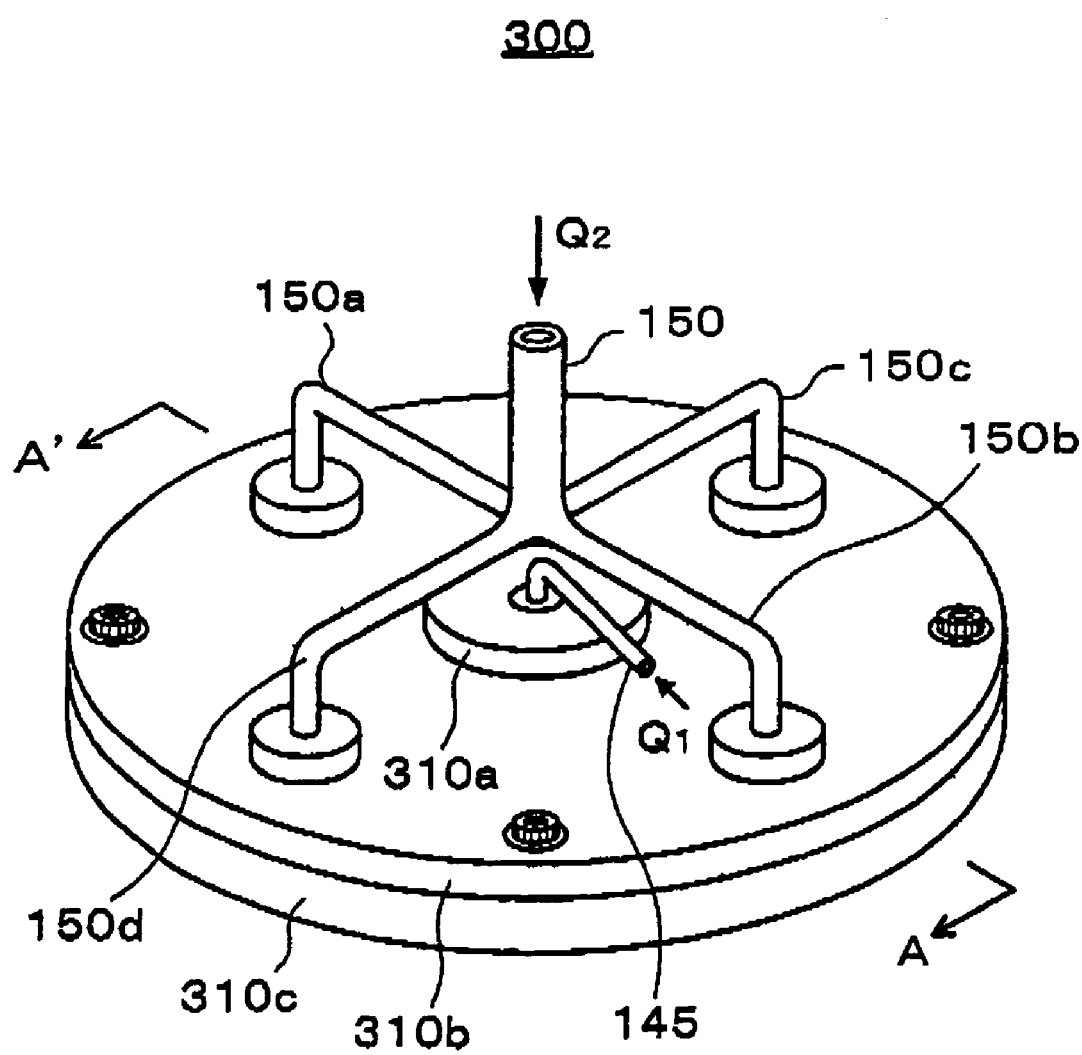
FIG. 5 presents an external view of a showerhead.
Figure 6:
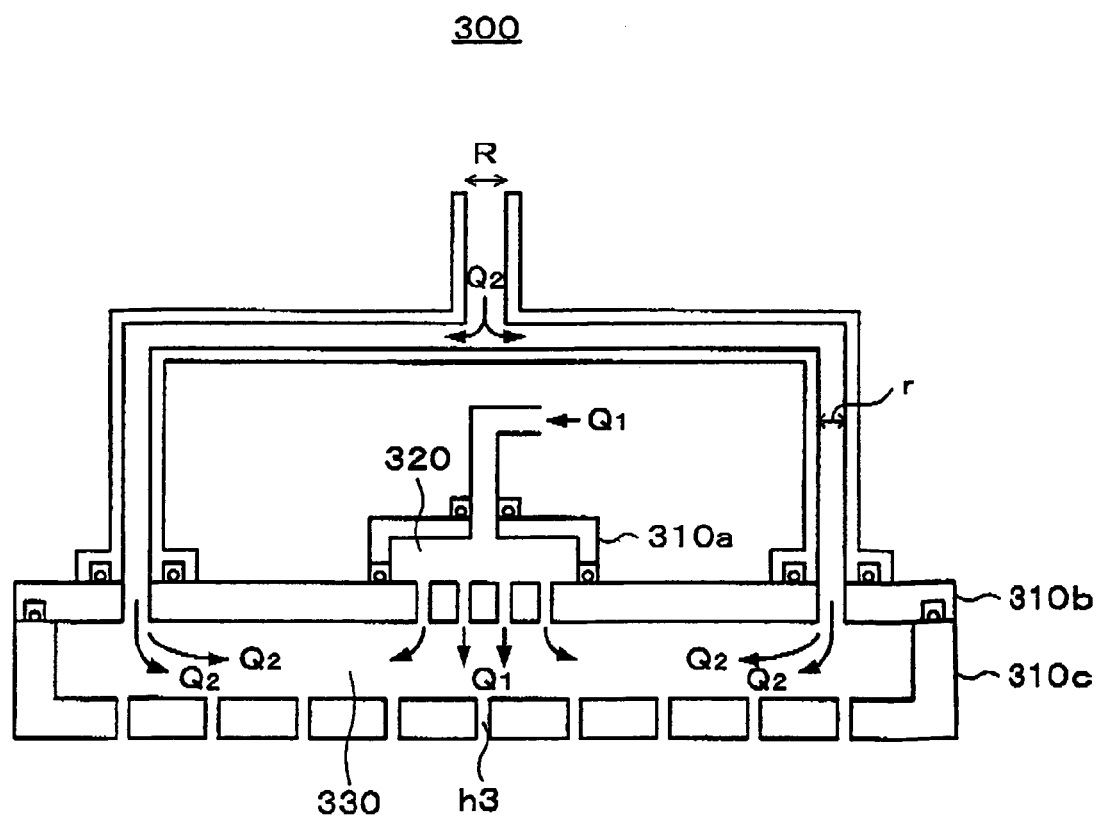
FIG. 6 is a sectional view of the showerhead across A-A' in FIG. 5.
Figure 7:
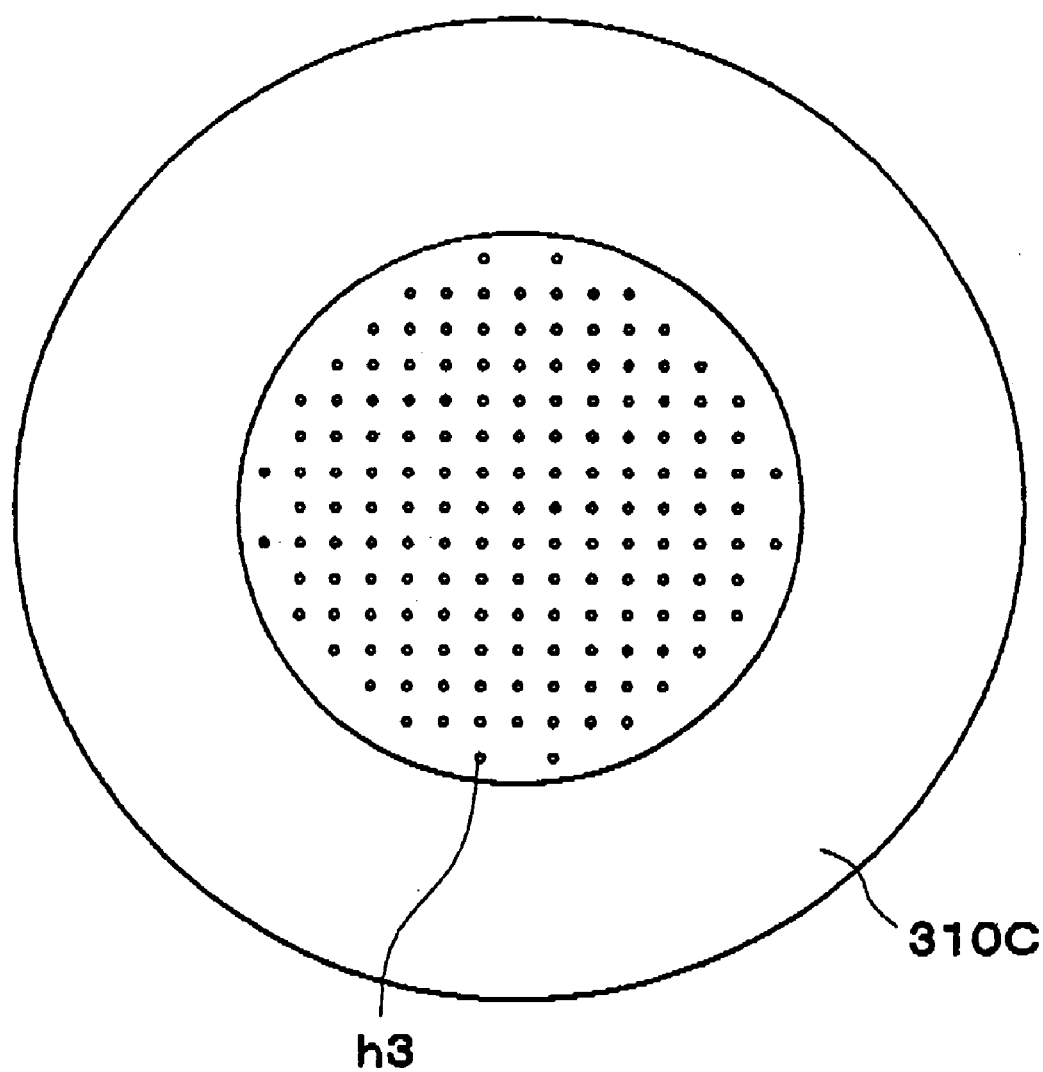
FIG. 7 presents an example of how the gas supply holes in the showerhead in FIG. 5 may be arranged.

The showerhead 300 representing another example of the gas supply mechanism is now explained in reference to FIGS. 5~7. It is to be noted that FIG. 5 is a perspective presenting a schematic external view of the showerhead 300 and FIG. 6 is a sectional view across A-A' in FIG. 5. FIG. 7 illustrates the arrangement of the gas supply holes.

The showerhead, 300 representing another example of the gas supply mechanism is provided with a primary gas supply system for supplying the primary gas Q1 supplied from the gas source 140 into the processing chamber 110 via a plurality of primary gas supply holes and a circulating gas supply system for supplying the circulating gas Q2 into the processing chamber 110 via a plurality of circulating gas supply holes, with the primary gas supply system and the circulating gas supply system constituted as systems independent of each other.

The showerhead 300 comprises a small first electrode plate 310a and larger second and third electrode plates 310b and 310c, which may be constituted of, for instance, alumite, as shown in FIG. 5. The first electrode plate 310a is made to communicate with the primary gas piping 145. The second electrode plate 310b is made to communicate with the circulating gas piping 150. In the example shown in the figure, the circulating gas piping 150 forks off in four pipings 150a, 150b, 150c and 150d, so as to prevent the conductance from becoming lowered and facilitate dispersion inside the showerhead 300. The piping radius r of the four pipings 150a, 150b, 150c and 150d is set essentially equal to the piping radius R of the circulating gas piping 150. For instance, the piping radius R of the circulating gas piping 150 may be set at approximately 10 mm, with the piping radius r of the pipings 150a, 150b, 150c and 150d also set at approximately 10 mm.

In addition, it is desirable to assume a structure for the showerhead 300 that allows it to be disassembled into parts with simple shapes, in order to facilitate the removal of byproducts and particles generated at the head surface, the internal gas path and the like during the process, and the structure shown in FIG. 4 allows the showerhead 300 to be disassembled into the three electrode plates to facilitate maintenance work.

The internal structure of the showerhead 300 is explained in reference to FIG. 6.

The space between the first electrode plate 310a and the second electrode plate 310b, which is made to communicate with the primary gas piping 145, constitutes a primary gas dispersion space 320 where the primary gas Q1 is dispersed. In addition, the space between the second electrode plate 310b and the third electrode plate 310c is made to communicate with the circulating gas piping 150 and constitutes a circulating gas dispersion space 330 in which the circulating gas Q2 is dispersed. Orings (sealing members) O are provided between the first electrode plate 310a and the second electrode plate 310b and also between the second electrode plate 310b and the third electrode plate 310c, to prevent the primary gas Q1 and the circulating gas Q2 from leaking.

The primary gas dispersion space 320 is made to communicate with the circulating gas dispersion space 330 via a passage defined by the second electrode plate 310b. The primary gas Q1 and the circulating gas Q2 are mixed in the circulating gas dispersion space 330. The mixed gas Q3 constituted of the primary gas Q1 and the circulating gas Q2 is supplied into the processing chamber 110 in a shower through a plurality of mixed gas supply holes h3.

It is to be noted that the back-pressure of the turbo pump 120 needs to be fairly high in order to mix the processing gases before they are supplied into the processing chamber 110 in this manner. In other words, the showerhead 300 is effective only when a turbo pump capable of operating (i.e., the evacuating rate does not become lowered) at a high back-pressure is employed.

The mixed gas supply holes h3 are formed at optimal positions determined through experience, simulation or the like, to ensure that the gas induced from the showerhead 300 into the processing chamber 110 travels onto the surface of the wafer W evenly. FIG. 7 presents an example of the positional arrangement that may be assumed by the primary gas supply holes h1 and the circulating gas supply holes h2, in conjunction with a high back-pressure turbo pump (with a back-pressure of approximately 10 Torr).

In FIG. 7, approximately 150 mixed gas supply holes h3 are bored, with their hole radius set at approximately 1 mm. The hole radius and the hole density of the mixed gas supply holes h3 are constant over the entire surface in FIG. 7. The hole density of the mixed gas supply holes h3 is set so as to ensure that the back-pressure is equal to or lower than the rated back-pressure of the turbo pump 120 when the primary gas Q1 and the circulating gas Q2 are supplied at their target flow rates.

As explained above, by setting the piping radius R of the circulating gas piping 150 (=the piping radius r of the pipings 150a, 150b, 150c and 150d) at approximately 10 mm and settling the back-pressure of the turbo pump 120 at approximately 7.7 Torr, the showerhead 300 is able to operate at a circulation rate of approximately 80%. In addition, it achieves a simpler structure compared to the showerhead 200 which includes the spacers s1 and s2 and the like.

Next, the conductance of the circulating gas piping 150 is explained. In order for the circulating gas Q2 to be supplied from the downstream side of the turbo pump 120 to the upstream side of the showerhead 200 with ease, the setting of the conductance at the circulating gas supply system is crucial. The conductance should be set at a sufficiently high level while talking into consideration the turbo pump performance. The conductance of the circulating gas piping 150, which is to be detailed later, is affected by the number and the diameter of the gas supply holes at the showerhead 200 or the showerhead 300.

It is desirable that the conductance of the circulating gas supply system be higher than the conductance of the primary gas supply system. At the same time, it needs to be adjusted so as not to lower the evacuating capability by taking into consideration the performance of the turbo pump 120. For instance, in the case of a standard turbo pump employed in a dry etching apparatus, the conductance of the circulating gas supply system needs to be adjusted so as to ensure that the back-pressure of the turbo pump is equal to or lower than 3 Torr. When a special turbo pump is used, the conductance should be adjusted so as to set the back-pressure equal to or lower than 10 Torr. However, it is to be noted that these characteristics represent specific examples, and the conductance of the circulating gas supply system should be adjusted so as to achieve a back-pressure equal to or lower than a specific back-pressure level corresponding to the characteristics of the particular turbo pump in use.

In the embodiment, the conductance of the circulating gas supply system is calculated by assuming that the length of the circulating gas supply piping 150 is 3 m, with its internal radius R set at 10 mm (in the case of the showerhead 300) or 40 nmm (in the case of the showerhead 200) and the circulating gas flows in a viscous flow area (1 Torr or higher). In addition, the conductance of the circulating gas outlet holes h2 is calculated by assuming that the radius of the circulating gas outlet holes h2 is set at 1 mm, the length (the width of the third electrode plate 210c) of the circulating gas outlet holes h2 is set at 10 mm, 100 or 300 holes are formed and the circulating gas is supplied in a molecular flow area (40 mTorr~1 mTorr). It is to be noted that the pressure inside the processing chamber 110 is sustained at a constant level of 40 mTorr.

(Table 1) shows the relationships among the number of holes at the showerhead, the gas outlet rate, the piping radius and the turbo pump back-pressure, achieved when a standard turbo pump is employed.

TABLE 1

| Shower type | h1 (number) | h2 (number) | Q1 (sccm) | Q2 (sccm) | V1 (m/s) | V2 (m/s) | R (mm) | C1 (l/s) | C2 (l/s) | TMP back-pressure (Torr) |
|---|---|---|---|---|---|---|---|---|---|---|
| no circulation | 125 | 0 | 375 | 0 | 1210 | — | — | — | — | — |
| circulation A | 25 | 100 | 75 | 300 | 1210 | 1210 | 10 | 2.7 | 1.0 | 5.1 |
| circulation B | 25 | 300 | 75 | 300 | 1210 | 403 | 10 | 1.5 | 3.1 | 3.8 |

TABLE 1-continued

| Shower type | h1 (number) | h2 (number) | Q1 (sccm) | Q2 (sccm) | V1 (m/s) | V2 (m/s) | R (mm) | C1 (l/s) | C2 (l/s) | TMP back-pressure (Torr) |
|---|---|---|---|---|---|---|---|---|---|---|
| circulation C | 25 | 100 | 75 | 300 | 1210 | 1210 | 40 | 575 | 1.0 | 3.7 |
| circulation D | 25 | 300 | 75 | 300 | 1210 | 403 | 40 | 197 | 3.1 | 1.3 |

It is to be noted that V1 represents the flow rate of the primary gas Q1 let out through the primary gas supply holes h1 and V2 represents the flow rate of the circulating gas Q2 let out through the circulating gas supply holes h2 in (Table 1) and (Table 2) which is to be referred to later. In addition, C1 represents the conductance of the circulating gas piping 150 and C2 represents the conductance of the circulating gas supply holes h2.

In addition, with C1 representing the conductance of the circulating gas piping 150 and C2 representing the conductance of the circulating gas supply holes h2, the overall conductance C achieved when the circulating gas piping 150 (conductance C1) and the circulating gas supply holes h2 (conductance C2) are provided in series is expressed as;

$$1/C = 1/C1 + 1/C2 = (C1+C2)/C1 \cdot C2$$

(Table 2) shows the relationships among the quantities of holes at the showerhead, the gas outlet rate, the piping radius and the turbo pump back-pressure achieved when a turbo pump capable of operating at a high back-pressure (i.e., the evacuating rate does not become lowered at a high back-pressure).

(3) Since the total number of the primary gas holes h1 and the circulating gas holes h2 at a type A showerhead and a type C showerhead is equal to that of the standard showerhead (i.e., the type of showerhead that does not circulate the gas), the same hole machining pattern as that for the standard showerhead can be used. By utilizing a type A showerhead or a type C showerhead, process performance comparable to that achieved by using the standard showerhead is realized.

(4) Since the number of circulating gas supply holes h2 is reduced, the circulating gas outlet rate V2 increases by using a type A showerhead or a type C showerhead. Thus, the deposition of impurities on the shower can be minimized.

(5) The radius R of the circulating gas piping can be reduced by using a type A showerhead or a type B showerhead. This allows the use of smaller parts, e.g., smaller valves. As a result, the space occupied by the entire apparatus can be reduced.

As explained above, a type A showerhead achieves the most desirable results with a type B showerhead or a type C

TABLE 2

| Shower type | h1 (number) | h2 (number) | Q1 (sccm) | Q2 (sccm) | V1 (m/s) | V2 (m/s) | R (mm) | C1 (l/s) | C2 (l/s) | TMP back-pressure (Torr) |
|---|---|---|---|---|---|---|---|---|---|---|
| no circulation | 125 | 0 | 625 | 0 | 2016 | — | — | — | — | — |
| circulation A | 25 | 100 | 125 | 500 | 2016 | 2016 | 10 | 4.2 | 1.0 | 7.7 |
| circulation B | 26 | 300 | 125 | 500 | 2016 | 872 | 10 | 2.2 | 3.1 | 5.0 |
| circulation C | 25 | 100 | 125 | 500 | 2016 | 2016 | 40 | 954 | 1.0 | 5.1 |
| circulation D | 25 | 300 | 125 | 500 | 2016 | 672 | 40 | 323 | 3.1 | 2.1 |

The results presented in (Table 1) and (Table 2) demonstrate that by employing a turbo pump capable of operating at a high back-pressure, the following advantages are achieved.

(1) The number of circulating gas supply holes h2 can be reduced in a type A showerhead and a type C showerhead, to achieve a reduction in the showerhead machining cost.

(2) With the number of circulating gas supply holes h2 reduced, the outlet rate V1 at which the primary gas Q1 is let out and the outlet rate V2 at which the circulating gas Q2 is let out can be set almost equal to each other at type A showerhead and type C showerhead. As a result, the surface uniformity with regard to the process characteristics such as the etching rate at the wafer W can be improved.

showerhead achieving the second highest degree of desirability and type D showerhead achieving the least desirable results in (Table 2).

The values presented in (Table 1) and (Table 2) described above only represent specific examples and, as long as the back-pressure of the turbo pump 120 can be adjusted at a specific level, optimal values may be selected as appropriate for the flow rate of the circulating gas Q2, the internal radius of the circulating gas piping 150 and the number of circulating gas outlet holes h2.

Next, a circulating gas control method that may be adopted in the processing apparatus 100 structured as described above is explained. The circulating gas control method is described in reference to an example in which the pressure inside the processing chamber 110 is sustained at 40 mTorr and approximately 80% of the gas evacuated from the processing chamber 110 is utilized as the circulating gas Q2. It is to be noted that while it is necessary to ascertain in advance the relationship between the quantity of the primary gas Q1 supplied during the process and the degrees of openness of the valves V1 and V2 provided to the front and rear of the turbo pump 120, the explanation is given on the assumption that the degrees of openness of the valves V1 and V2 must be at 30% and 20% respectively when the supply quantity of the primary gas Q1 is 60 sccm (the supply quantity of the circulating gas Q2 is 240 sccm).

First, in a state in which the valves V1 and V2 provided to the front and rear of the turbo pump 120 are opened and the valves V3 and V4 inside the circulating gas piping 150 are closed, the gas inside the processing chamber 110 is evacuated by employing the turbo pump 120 and the dry pump 130. Next, with the degree of openness of the valve V1 fixed at 30%, the primary gas Q1 is supplied from the gas source 140 at 60 sccm. After the flow rate is stabilized by the flow regulating device MFC, the degree of openness of the valve V2 is fixed at 20%. By setting the degree of openness of the valve V2 at 20%, a portion of the processing gas evacuated from the processing chamber 110 by the turbo pump 120 is allowed to flow into the circulating gas piping 150.

Then, the valves V3 and V4 inside the circulating gas piping 150 are opened. By opening the valves V3 and V4, the portion of the processing gas having flowed into the circulating gas piping 150 is allowed to flow back into the showerhead 200 as the circulating gas Q2. When the flow rate of the circulating gas K2 becomes stabilized at approximately 240 sccm, the pressure P2 inside the processing chamber 110 is approximately 40 mTorr. The processing starts in this state.

When the processing is completed, the valve V0 inside the primary gas supply piping 145 and the valves V3 and V4 inside the circulating gas supply piping 150 are closed simultaneously. The processing gas Q2 remaining in the circulating gas supply piping 150 in the area enclosed by the valves V3 and V4 when the valves V3 and V4 are closed is used in the next process. For instance, if the radius, the length and the gas pressure of the circulating gas supply piping 150 are respectively 40 mm, 3 m and 1 Torr, the quantity of the residual gas remaining between the valves V3 and V4 is approximately 3.8 Torr·l (5.0 scc), and by utilizing this residual gas for the next process, the initialization for the next process can be completed approximately five seconds faster. Then, the valves V1 and V2 are completely opened.

The sequence through which the length of time to elapse before the circulation is stabilized is reduced by using the buffer space is now explained. The circulating gas induction piping 150 is divided into piping portions 151, 152 and 153 in order to facilitate the explanation. Namely, the piping 151 corresponds to the space enclosed by the piping on the downstream side of the turbo pump and the valves V2 and V3, which has a volumetric capacity of approximately 1000 cc. In addition, separate explanations are given on the processing on the first wafer and the processing on a subsequent wafer.

In contact hole formation, for instance, the processing is performed at $C_4F_8/CO/Ar/O_2=10/50/200/5$ sccm with no circulation, and at $C_4F_8/CO/Ar/O_2=6/10/40/5$ sccm with a circulation rate at 80%.

First, the processing of the first wafer is explained.
(Before Gas Induction)

The valve V4 is closed while the valves V1, V2 and V3 are opened. At this time, the processing chamber 110 and the space corresponding to the piping 153 are evacuated to achieve a pressure level of approximately $10^{-6}$ Torr through the evacuating capacities of the turbo pump 120 and the dry pump 130. The downstream side of the turbo pump 120 and the flow areas in the pipings 151 and 152 are evacuated through the evacuating capacity of the dry pump 130 alone.

(Gas Induction~Stabilization)

The quantity of the primary gas Q1 that is induced when performing processing by circulating 80% of the processing gas is expressed as (1) $Q1=C_4F_8/CO/Ar/O_2=6/10/40/5$ sccm. Until the pressure in the areas corresponding to the pipings 151 and 152 rises to a sufficient level (e.g., 2 Torr), the primary gas Q1 is supplied at the maximum flow rate of the flow regulating device MFC while ensuring that the flow rate ratios above are sustained, i.e., by sustaining Q1 at (2) $Q1=C_4F_8/CO/Ar/O_2=30/50/200/25$ sccm. At this time, the pressure P2 inside the processing chamber 110 is adjusted through the valve V1, while sustaining the valves V2 and V4 in a closed state and the valve V3 in an open state.

The length of time required for the pressure in the space in the pipings 151 and 152 (with the volumetric capacity of approximately 3800 cc) to become equal to the pressure P3, i.e., 2 Torr is 12.5 seconds when (1) $Q1=C_4F_8/CO/Ar/O_2=6/10/40/5$ sccm (total 61 sccm) and 2.5 seconds when (2) $Q1=C_4F_8/CO/Ar/O_2=30/50/200/25$ sccm (total 305 sccm).

Thus, after raising the pressure in the pipings 151 and 152 (e.g., up to 2 Torr) at the flow rate (2) $Q1=C_4F_8/CO/Ar/O_2=30/50/200/25$ sccm, the valve V4 is opened to start circulation. At the same time, the Slow rate of the primary gas Q1 is changed to (1) $Q1=C_4F_8/CO/Ar/O_2=6/10/40/5$ sccm and the control on the valve V2 is started so as to set the pressure P3 to a value which will allow a desired flow rate for the circulating gas Q2 (circulation rate; 80%).

Subsequently, when the flow rate of the primary gas Q1 is stabilized and the pressures P2 and P3 are also stabilized, at which point in time the gas circulation can be considered to have entered a steady state, an RF discharge is started to implement processing on the wafer W.

(Completion of Wafer Processing)

Upon completion of the RF discharge, the flow rate of the primary gas Q1 is set to 0 sccm, and the valves V1 and V2 are opened to release the gas inside the processing chamber 110. At the same time, the valves V3 and V4 are closed to trap the gas that has been circulating in the space inside the piping 152. The gas thus trapped in the space in the piping 152 is utilized for stabilizing the circulating gas in the processing of the second wafer.

Next, the processing of the subsequent wafer is explained.
(Before Gas Induction)

The valves V1 and V2 are opened while the valves V3 and V4 are closed. It is assumed that at this time, the circulating gas Q2 remaining inside the piping 152 achieves a pressure level of 2 Torr.

(Gas Induction~Stabilization)

As in the processing of the first wafer, the flow rate of the primary gas Q1 is set at (2) $Q1=C_4F_8/CO/Ar/O_2=30/50/200/25$ sccm. At this time, the pressure P2 inside the processing chamber 110 is adjusted through the valve V1, while sustaining the valves V3 and V4 and also the valve V2 in a closed state.

In order to stabilize the gas circulation while processing a subsequent wafer, the gas must be accumulated at a specific pressure into the space inside the piping 151, since some gas is trapped inside the piping 152 constituting the buffer space. The length of time required for gas at 2 Torr to be accumulated inside the space in the piping 151 at the flow rate; (2) $Q1=C_4F_8/CO/Ar/O_2=30/50/200/25$ sccm is 0.5 sec. After the 0.5 sec period is up, the valves V3 and V4 are opened to start gas circulation. At the same time, the flow rate of the primary gas Q1 is changed to (1) Q1=$C_4F_8$/CO/Ar/$O_2$=6/10/40/5 sccm. The control on the valve V2 is started to achieve a desired predetermined level for the pressure P3.

Subsequently, steps similar to those taken to process the first wafer are implemented.

As explained above, by trapping gas in the piping 152 constituting the buffer space upon the completion of wafer processing, the length of time required for stabilizing the gas circulation when processing a subsequent wafer is reduced. In addition, by inducing the primary gas Q1 at the maximum flow rate for the flow regulating device MFC in use while sustaining a specific gas flow rate ratio and holding the valve V2 in a closed state at the induction start, the length of time required to achieve gas circulation stabilization at a specific gas circulation rate can be reduced.

In the embodiment, the circulating gas supply piping 150 is made to directly communicate with the showerhead 200. The showerhead 200 is provided with the primary gas supply system (the primary gas dispersion space 220 and the primary gas supply holes h1) and the circulating gas supply system (the circulating gas dispersion space 230 and the circulating gas supply holes h2), which are constituted as systems independent of each other, so that the primary gas Q1 and the circulating gas Q2 are allowed to become mixed only inside the processing chamber 110. As a result, the circulating gas Q2 can be controlled with ease without having to implement pressure control such as reducing the pressure on the upstream side of the showerhead 200 and raising the back-pressure of the turbo pump 120.

Furthermore, since the valves V3 and V4 for constituting the buffer space in which the circulating gas Q2 is temporarily reserved are provided in the circulating gas supply piping 150, the circulating gas Q2 remaining in the circulating gas supply piping 150 after the processing can be temporarily reserved to be utilized in the next process. Thus, since it is not necessary to evacuate the gas remaining in the circulating gas supply piping 150, the emission quantity of the gas can be reduced. In addition, the quantity of gas consumed in the subsequent process is reduced and the length of time required for the initial setting in the process is reduced as well.

Second Embodiment

The second embodiment of the present invention is now explained.

Figure 8:
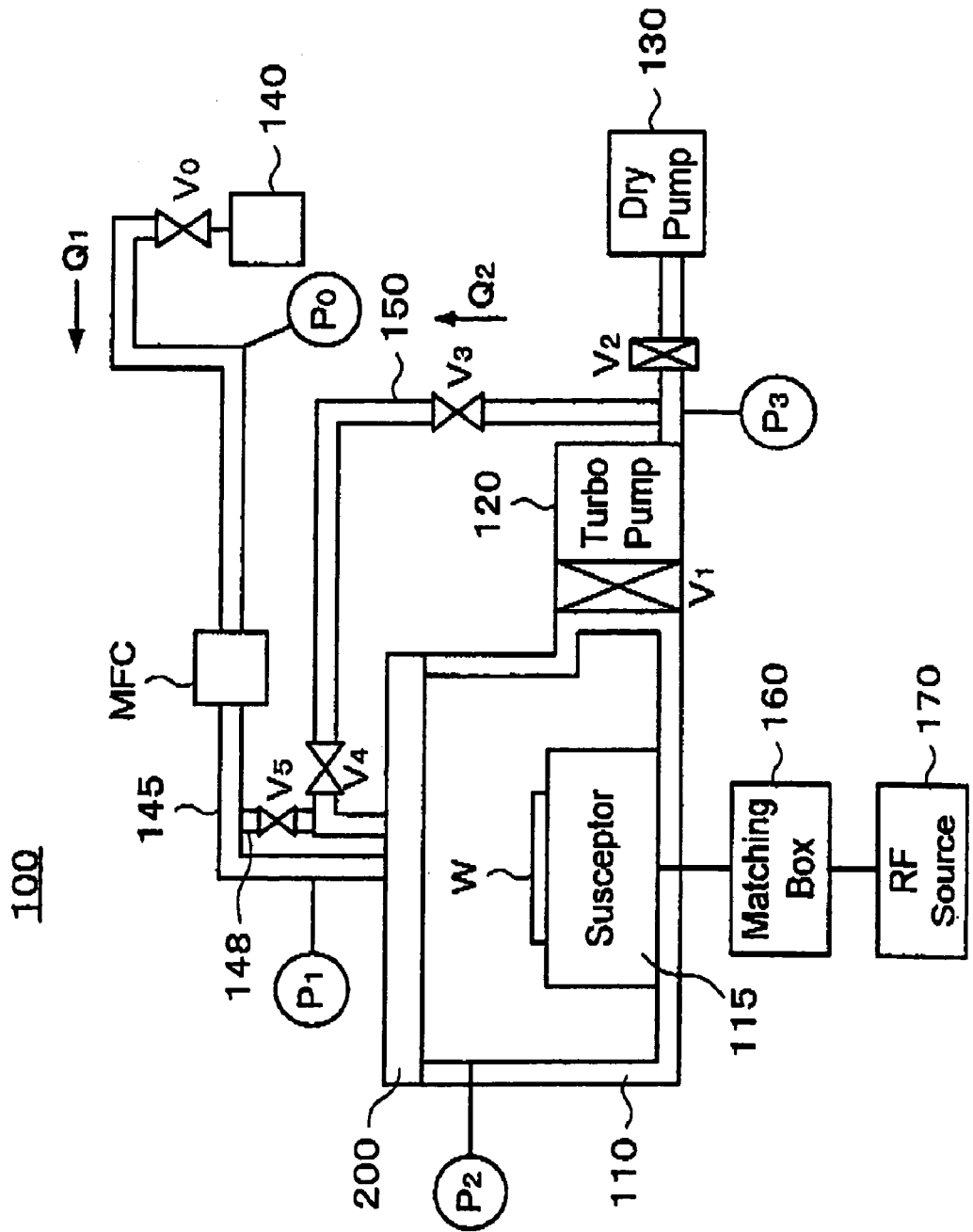
FIG. 8 illustrates the internal structure of the processing apparatus in a second embodiment.

As illustrated in FIG. 8, the processing apparatus in the embodiment is characterized by a second primary gas piping 148 provided to supply the primary gas Q1 through the circulating gas supply holes and a valve V5 constituting a means for flow rate adjustment for the primary gas Q1 provided at the second primary gas piping 148. It is to be noted that components other than the second primary gas piping 148 and the valve V5 assume structures identical to those in the first embodiment.

In the embodiment, the circulating gas supply holes h2 can be utilized as supply holes for the primary gas Q1 when processing which does not require the circulating gas Q2 is implemented. In such a case, with the valve V5 provided at the second primary gas piping 148, better flow control is achieved when supplying the primary gas Q1 through the circulating gas supply holes h2. As a result, an improvement is achieved in the flow rate control in sequential processing in which processing is first performed by using the primary gas alone (the primary gas is then discarded) and the processing is next performed by using both the primary gas and the circulating gas.

The following is an explanation of an example of the sequential processing in which processing is first performed by the primary gas alone and then processing is performed by using both the primary gas and the circulating gas.

(First Stage)

First, processing is performed for 30 seconds with the gas flow rate set at $N_2$/$O_2$=80/40 sccm, the pressure set at 20 mTorr and the power level set at 120 W. Since the processing gas does not contain any global warming gas (PFC) and also the processing period is short, the processing gas is not circulated. At this time, by opening the valve V5, the primary gas Q1 is supplied through both the primary gas supply holes h1 and the circulating gas supply holes h2.

(Second Stage)

Next, processing is performed for 180 seconds with the gas flow rate set at $C_4F_8$/CO/Ar=10/50/80 sccm, the pressure set at 60 mTorr and the power level set at 1500 W (DRM standard power level). Since the processing gas contains $C_4F_8$, which is a global wakig gas (PFC), and the processing period is long, the processing gas is circulated. During this process, by closing the valve V5, the primary gas Q1 is supplied through the primary gas supply holes h1 and the circulating gas Q2 is supplied through the circulating gas supply holes h2.

As explained above, when implementing processing which does not utilize the circulating gas Q2, the circulating gas supply holes h2, too, can be utilized as supply holes for the primary gas Q1 in the embodiment. Since the valve V5 is provided at the second primary gas piping 148, an improvement is achieved in the flow rate control when supplying the primary gas Q1 through the circulating gas supply holes h2.

(Implementation Examples)

Next, implementation examples achieved by employing the processing apparatus according to the present invention are explained. It is to be noted that since (a) a contact hole formation process, (b) an SAC (self aligning contact) process and (c) an SiN: groove formation process are implemented in the individual implementation examples by using the processing apparatus 100 explained earlier in reference to the embodiments, the same reference numbers are assigned to components having functions and structural features roughly identical to those of the processing apparatus 100 and the wafer W, to preclude the necessity for repeated explanation thereof. In addition, unless specially noted, the etching process conditions are set roughly the same as those used in the embodiments explained earlier.

(a) Contact Hole Formation Process

The gas flow rate is set at $C_4F_8$/CO/Ar/$O_2$=10/50/200/5 sccm. The etching characteristics achieved at this gas flow rate include an oxide film etching rate of approximately 500 nm mm and a selection ratio of the oxide film relative to the photoresist constituting the mask at approximately 5.5.

Similar etching characteristics are achieved at $C_4F_8$/CO/Ar/$O_2$=5/10/40/5 sccm by circulating the processing gas at a circulation rate of approximately 80% and adjusting the gas flow rate accordingly. Namely, an oxide film etching rate of 500 nm/min and a resist-relative selection ratio of 5.5 are achieved.

(b) SAC Process

Figure 9:
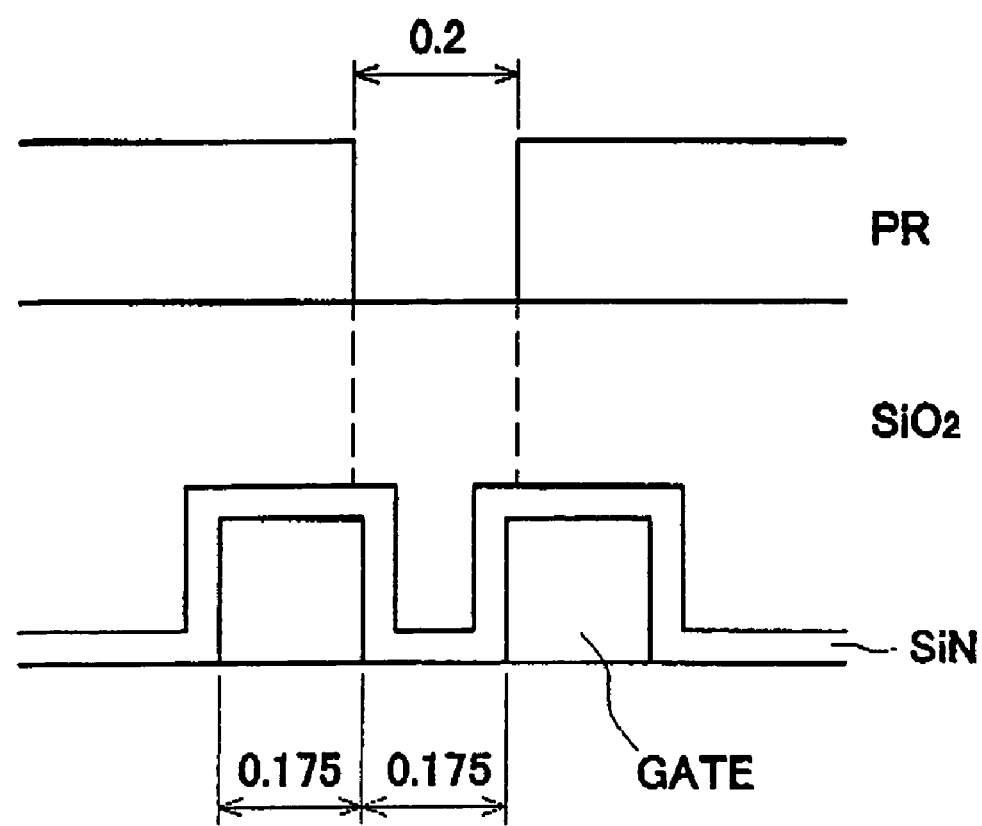
FIG. 9 is a sectional view schematically illustrating the etching shape achieved through the SAC process.

A flow rate of $C_4F_8$/CO/Ar/=16/300/380 sccm is adjusted to $C_4F_8$/CO/Ar/=7.5/45/80 sccm by circulating the processing gas at a rate of approximately 80%. An $SiO_2$ etching rate of 450 nm/min and an SiN relative selection ratio of 14 are achieved. It is to be noted that FIG. 9 presents a sectional view schematically illustrating the etching shape achieved through the SAC process.

(c) SiN: Groove Formation Process

A flow rate of $CF_4/Ar/O_2=80/160/20$ sccm is adjusted to $CF_4/Ar/O_2=16/32/12$ sccm by circulating the processing gas at a rate of approximately 80%. An SiN etching rate of 200 nm/min is achieved.

As described above, as typical examples of oxide ail etching processes, processes that use $C_4F_8$ or $CF_4$ are implemented in the implementation examples. By adjusting the gas flow rates through a circulation process, similar etching shapes are achieved without having to change other parameters such as the pressure, the level of applied power and the like among the processing conditions. In other words, it has been confirmed through the comparison of etching shapes achieved by circulating the processing gas and without circulating the processing gas that similar etching shapes are achieved in the contact hole formation process, the SAC process and the SiN: groove formation process.

While the invention has been particularly shown and described with respect to preferred embodiments of the processing apparatus according to the present invention by referring to the attached drawings, the present invention is not limited to these examples and it will be understood by those skilled in the art that various changes in form and detail may be made therein without departing from the spirit, scope and teaching of the invention.

For instance, while the hole density of the circulating gas supply holes is set so as to ensure that the back-pressure is equal to or lower than the rated back-pressure of the turbo pump when the circulating gas is supplied at the target flow rate in the embodiments described above, the present invention is not restricted by these particulars. For instance, the back-pressure of the turbo pump can be set equal to or less than the rated back-pressure by setting the hole radius of the circulating gas supply holes at a specific value.

In addition, while an explanation is given in reference to the embodiment on an example in which the residual circulating gas is reserved in an area of the circulating gas piping 150 representing an example of the gas circulating mechanism after the processing is completed, such a buffer space may be provided at the primary gas supply system side instead.

Furthermore, a means for circulating gas filtration such as a filter may be provided at the circulating gas supply piping. Since byproducts and particles contained in the circulating gas can be removed at the means for filtration, the degree to which the workpiece is adversely affected by the circulating gas is minimized and easier maintenance is achieved.

While an explanation is given in reference to the embodiments on an example in which the primary gas Q1 and the circulating gas Q2 are induced into the showerhead 200, the structure of the showerhead achieved in the present invention may also be adopted in, for instance, a processing apparatus in which two types of processing gases are induced from two separate processing gas sources.

As explained above, according to the present invention having a primary gas supply system and the circulating gas supply system provided in the gas supply mechanism with the primary gas supply system and the circulating gas supply system constituted as systems independent of each other, the primary gas and the circulating gas are allowed to become mixed only in the processing chamber. As a result, easier control of the circulating gas is achieved without having to implement pressure control such as reducing the pressure on the upstream side of the gas supply mechanism and raising the back-pressure of the evacuating mechanism. In addition, since the primary gas supply system and the circulating gas supply system are constituted as systems independent of each other, the pressure or the flow rate at either gas supply system can be controlled independently, unaffected by the other gas supply system.

Furthermore, according to the present invention, the circulating gas remaining in the gas circulating mechanism and/or the circulating gas supply system can be temporarily reserved in the buffer space after the process is completed, to be used for the next process. Thus, since it is not necessary to evacuate the gas remaining at the circulating gas supply system, the emission quantity of the gas can be reduced. In addition, during the subsequent process, the quantity of gas consumption can be reduced and the length of time required for the initial setting of the processing can be reduced.

Moreover, since byproducts and particles contained in the circulating gas can be removed according to the present invention, the degree to which the workpiece is adversely affected by the circulating gas can be minimized and easier maintenance work is achieved.

The entire disclosure of Japanese Patent Application No. 11-291270 filed on Oct. 13, 1999 including specification, claims, drawings and summary is incorporated herein by reference in its entirety.

What is claimed is:

1. A processing method for processing a workpiece by using processing gases constituted of a primary gas and a circulating gas in a processing apparatus, the processing apparatus including a gas supply mechanism that supplies a processing gas into a processing chamber via a plurality of gas supply holes formed at a shower head, the showerhead including a plurality of plates, a plurality of primary gas supply holes, a plurality of circulating gas supply holes, an evacuating mechanism that evacuates the processing gas from said processing chamber, and a gas circulating mechanism that returns at least a portion of exhaust gas evacuated from said processing chamber to said gas supply mechanism, wherein said gas supply mechanism includes a primary gas supply system that supplies the primary gas supplied from a processing gas source into said processing chamber via said primary gas supply holes, and a circulating gas supply system that supplies at least a portion of the exhaust gas into said processing chamber via said circulating gas supply holes, wherein said primary gas supply system and said circulating gas supply system are systems independent of each other at said shower head, the method comprising:

before a first workpiece is processed, a step of evacuating the processing chamber using a first pump and a second pump, and evacuating the circulating gas supply system using the second pump, a step in which a pressure inside the processing chamber and said gas circulating mechanism is raised by supplying the primary gas into said processing chamber through said primary gas supply holes and allowing the exhaust gas to flow into said gas circulating mechanism without returning any portion of the exhaust gas to the atmosphere;

a step in which a stabilized flow rate of the circulating gas is supplied to the processing chamber by returning a portion of the exhaust gas to the gas supply mechanism to supply the circulating gas through said circulating gas supply holes;

a step of processing the first workpiece;

a step of trapping the circulating gas at the end of the processing of the first workpiece and evacuating the processing chamber using the first and second pumps; and a step of re-executing the pressurization step in preparation for processing a subsequent workpiece.

2. The method of claim 1, wherein the flow rate of the primary gas supplied during said step in which the pressure inside the gas circulating mechanism is raised and in which the workpiece is not processed is higher than the flow rate of the primary gas supplied during said step in which the workpiece is processed.

3. The method of claim 2, wherein a ratio of the gas components of the primary gas supplied during said step in which the pressure inside said gas circulating mechanism is raised and in which the work piece is not processed is equal to a ratio of the gas components of primary gas supplied during said step in which the work piece is processed.

4. The method of claim 1, wherein the showerhead includes a first electrode plate, a second electrode plate, and a third electrode plate.

5. The method of claim 1, wherein the first pump is a turbo pump.

6. The method of claim 1, wherein the second pump is a dry pump.

* * * * *